United States Patent
Huang

(10) Patent No.: US 8,428,211 B2
(45) Date of Patent: Apr. 23, 2013

(54) LOCK DETECTION CIRCUIT AND METHOD FOR PHASE LOCKED LOOP SYSTEM

(75) Inventor: Chun-Che Huang, Taipei (TW)

(73) Assignee: VIA Technologies, Inc., New Taipei (TW)

( * ) Notice: Subject to any disclaimer, the term of this patent is extended or adjusted under 35 U.S.C. 154(b) by 1387 days.

(21) Appl. No.: 11/668,475

(22) Filed: Jan. 30, 2007

(65) Prior Publication Data

US 2008/0080658 A1 Apr. 3, 2008

(30) Foreign Application Priority Data

Sep. 29, 2006 (TW) .............................. 95136174 A

(51) Int. Cl.
*H03D 3/24* (2006.01)
(52) U.S. Cl.
USPC ............................ 375/376; 375/294; 375/215
(58) Field of Classification Search .................. 375/376, 375/294, 215
See application file for complete search history.

(56) References Cited

U.S. PATENT DOCUMENTS

| | | | | |
|---|---|---|---|---|
| 5,724,007 A * | 3/1998 | Mar | ............................... | 331/1 A |
| 5,909,130 A * | 6/1999 | Martin et al. | .................... | 327/12 |
| 6,150,859 A * | 11/2000 | Park | .............................. | 327/158 |
| 6,320,469 B1 * | 11/2001 | Friedberg et al. | ............. | 331/1 A |
| 6,373,301 B1 * | 4/2002 | Chen et al. | ..................... | 327/141 |
| 6,411,143 B1 * | 6/2002 | Fernandez-Texon | ......... | 327/156 |
| 6,762,631 B1 * | 7/2004 | Kumar | .......................... | 327/142 |
| 7,015,725 B1 * | 3/2006 | Yu et al. | .......................... | 327/12 |
| 7,215,207 B2 * | 5/2007 | Hsieh | ............................... | 331/14 |
| 7,282,971 B2 * | 10/2007 | Panpalia et al. | ............... | 327/149 |
| 7,424,082 B2 * | 9/2008 | Choi | ............................. | 375/371 |
| 7,649,421 B2 * | 1/2010 | Victor | ............................. | 331/16 |
| 2004/0263225 A1 * | 12/2004 | Perrott et al. | ................. | 327/156 |
| 2005/0110536 A1 * | 5/2005 | Ho | ................................ | 327/156 |

* cited by examiner

*Primary Examiner* — Shuwang Liu
*Assistant Examiner* — Nader Bolourchi
(74) *Attorney, Agent, or Firm* — Huffman Law Group, P.C.

(57) ABSTRACT

A lock detection circuit and method are disclosed for phase locked loop (PLL) systems. The lock detection circuit primarily includes a delay unit and an asserting logic unit. The delay unit receives the phase error signal of the PLL and produces a present phase error signal, and then accordingly generates at least one delayed phase error signal. The asserting logic unit generates an unlock indicating signal (UNLOCK) according to the present phase error signal and the delayed phase error signal. A phase lock indicating signal will be asserted if the unlock indicating signal is not asserted within a predetermined number of counting pulses.

23 Claims, 6 Drawing Sheets

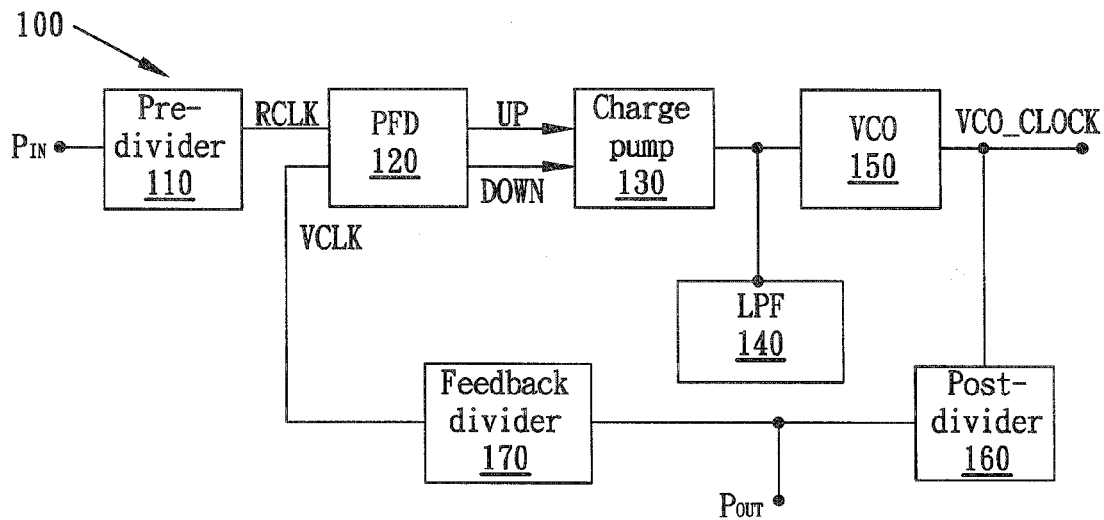
FIG. 1 (Prior Art)
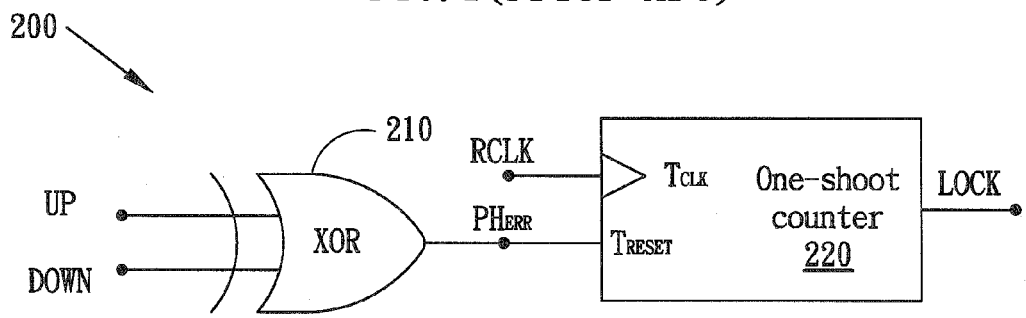
FIG. 2A (Prior Art)
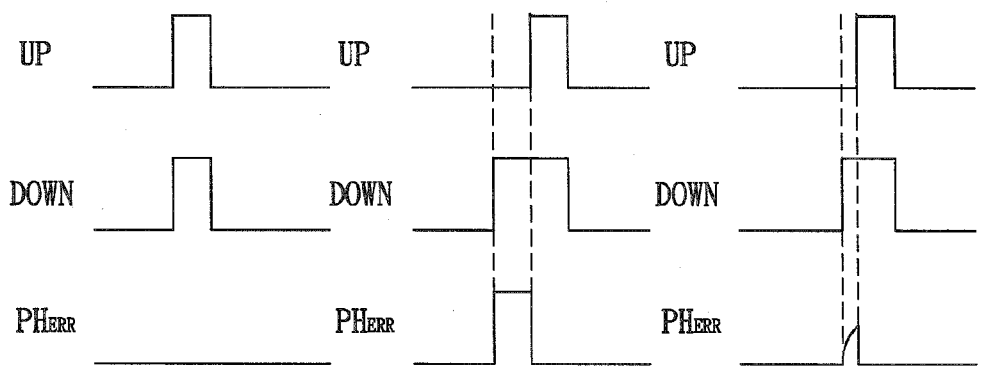
FIG. 2B
(Prior Art)
FIG. 2C
(Prior Art)
FIG. 2D
(Prior Art)

LOCK DETECTION CIRCUIT AND METHOD FOR PHASE LOCKED LOOP SYSTEM

BACKGROUND OF THE INVENTION

1. Field of the Invention

The present invention relates to integrated circuit design, and more particularly to a lock detection circuit and method for a phase locked loop (PLL) system.

2. Description of the Prior Art

FIG. 1 shows a block diagram of a typical phase locked loop system in accordance with prior art. The phase locked loop system 100 includes a pre-divider 110, a phase frequency detector (PFD) 120, a charge pump 130, a low pass filter (LPF) 140, a voltage controlled oscillator (VCO) 150, a post-divider 160, and a feedback divider 170. The pre-divider 110 receives an input clock signal PIN and outputs a divided reference clock signal RCLK to the phase frequency detector 120. The phase frequency detector 120 is connected to the feedback divider 170 and receives a divided VCO clock signal VCLK therefrom. The phase frequency detector 120 has two output terminals outputting an UP clock signal and a DOWN clock signal to the charge pump 130. The charge pump 130 is connected to the low pass filter 140 and the voltage controlled oscillator 150. The voltage controlled oscillator 150 is connected to the post-divider 160 and outputs a voltage controlled oscillating clock signal VCO_CLOCK. The output terminal of the post-divider 160 provides the output clock signal $P_{OUT}$ of the phase locked loop system 100 and connects to the feedback divider 170. The feedback divider 170 divides the output clock signal $P_{OUT}$ and outputs the divided VCO clock signal VCLK to the phase frequency detector 120.

When the phase locked loop system 100 is in steady state, the phase difference and frequency difference between the reference clock signal RCLK and the divided VCO clock signal VCLK received by the phase frequency detector 120 should approach zero. In such a state, the phase locked loop is said to be in a "lock" condition or "locked". After initialization, a phase locked loop needs a period of delayed time before it attains a steady state. The output clock signal $P_{OUT}$ of the phase locked loop system 100 before it acquires lock is not stable and should not be used. Accordingly, a lock detection circuit is usually employed for a phase locked loop system to determine if the phase locked loop system is already in a locked state. Such a lock detection circuit avoids the frequency measuring overhead for the output clock signal of a phase locked loop system so as to simplify any testing routine.

FIG. 2A shows a schematic diagram of a conventional lock detection circuit 200 which includes an exclusive OR (XOR) gate 210 and a one-shoot counter 220. The XOR gate 210 receives the UP clock signal and the DOWN clock signal of the phase locked loop system 100, and then outputs a phase error signal $PH_{ERR}$ to the reset terminal $T_{RESET}$ of the one-shoot counter 220. On the other hand, the reference clock signal RCLK of the phase locked loop system 100 is coupled to the clock input terminal $T_{CLK}$ of the one-shoot counter 220. The output terminal of the one-shoot counter 220 provides a phase lock indicating signal LOCK. When a locked state is detected, the phase lock indicating signal LOCK goes high and remains at high level until before a reset signal is received at the reset terminal $T_{RESET}$. The lock detection circuit 200 is capable of detecting the static phase error of a phase locked loop system. The phase difference at the input of the phase frequency detector 120 is called the static phase error. In ideal case, the static phase error is zero when the phase locked loop system is locked. In practice, however, a phase locked loop system will be considered to be locked as long as the static phase error is less than a predetermined threshold.

As shown in FIG. 2A, the XOR'ed result $PH_{ERR}$ of the UP clock signal and the DOWN clock signal may represent the static phase error. After the phase locked loop system starts running, the clock input terminal $T_{CLK}$ of the one-shoot counter 220 keeps receiving the reference clock signal RCLK. If there is no valid $PH_{ERR}$ resets the one-shoot counter 220 within a predetermined number of RCLK clocks, the one-shoot counter 220 will output a high level and remain at the high level until any valid $PH_{ERR}$ is received at the reset terminal $T_{RESET}$.

As described above, the lock detection circuit 200 determines the level of the static phase error according to the XOR result of the UP clock signal and the DOWN clock signal from the phase locked loop system 100. Several signal diagrams corresponding to different levels of static phase errors are shown in FIG. 2B through FIG. 2D. All diagrams contain the relative waveforms of the UP clock signal, the DOWN clock signal, and the result phase error signal $PH_{ERR}$. In ideal case, when the phase locked loop system 100 is perfectly locked, the UP clock signal and the DOWN clock signal will have identical frequency and phase such that the phase error will remain at low level as shown in FIG. 2B. In practical case, the frequencies or phases of the UP clock signal and the DOWN clock signal will be different as shown in FIG. 2C. The difference therebetween is transformed to a high level through the XOR gate 210. The duration of the high level represents the level of the phase error. When the frequency and phase difference between the UP clock signal and the DOWN clock signal is minor as shown in FIG. 2D, the phase locked loop system may be considered to be locked in this case. A practical lock detection circuit should be able to detect the unlocked situation as shown in FIG. 2C and neglect the noise as shown in FIG. 2D.

Due to element mismatching, process variation, and temperature, the conventional lock detection circuit 200 sometimes fails to disregard a negligible minor static phase error such that an already locked phase locked loop may be misconstrued to be unlocked. In other words, the phase error tolerance of the conventional lock detection circuit 200 may fail to meet a practical requirement. In addition, the phase error tolerance of the conventional lock detection circuit 200 of FIG. 2A can not be changed. It lacks the capability and flexibility to adjust the phase error tolerance for different applications. In view of the drawbacks of the conventional lock detection circuit, there is a need to provide a more flexible lock detection circuit which is also invariant with respect to element mismatching, process variation, or temperature.

SUMMARY OF THE INVENTION

The present invention provides a lock detection circuit for a phase lock loop (PLL) system. The lock detection circuit primarily includes a delay unit and an asserting logic unit. The delay unit receives clock signals of the PLL and produces a present phase error signal, and then generates at least one delayed phase error signal according to the present phase error signal. The asserting logic unit generates an unlock indicating signal according to the present phase error signal and the delayed phase error signal. In one embodiment, a selection device is used to select one of the delayed phase error signals so as to adjust the phase error tolerance.

The present invention also provides a lock detection circuit for a phase locked loop system, including an input clock error detection logic unit, a sampling logic unit, and a counting logic unit. The input clock error detection logic unit provides a phase error signal according to a reference clock signal and a divided VCO (voltage controlled oscillator) clock signal of the phase locked loop system. The sampling logic unit generates a present phase error signal according to the phase error signal, and then generates at least one delayed phase error signal according to the present phase error signal, and then generates an unlock indicating signal according to the present phase error signal and the delayed phase error signal. The counting logic unit is employed to count the reference clock signal. A phase lock indicating signal is asserted if the unlock indicating signal is not asserted within a predetermined number of pulses of the reference clock signal.

In accordance with another embodiment, the present invention provides a lock detection method for a phase locked loop system. The method includes generating a phase error signal according to a reference clock signal and a divided VCO clock signal of the phase locked loop system; generating a present phase error signal according to the phase error signal, and then generating at least one delayed phase error signal according to the present phase error signal. The method also includes generating and asserting an unlock indicating signal according to the states of the present phase error signal and the delayed phase error signal. The method further includes counting pulses of the reference clock signal, and then asserting a phase lock indicating signal if the unlock indicating signal is not asserted within a predetermined number of the pulses.

BRIEF DESCRIPTION OF THE DRAWINGS

FIG. 1 shows a block diagram of a typical phase locked loop system in accordance with prior art.

FIG. 2A shows a schematic diagram of a conventional lock detection circuit.

FIG. 2B through FIG. 2D shows signal diagrams corresponding to different levels of static phase errors in conventional lock detection circuits.

DETAILED DESCRIPTION OF THE INVENTION

In this specification (as well as the claims), being logically asserted means being set to logic "1" which may refer to a high voltage level in a positive logic system or a low voltage level in a negative logic system. Similarly, for a logic signal, being asserted means being set to logic "1".

Figure 3:
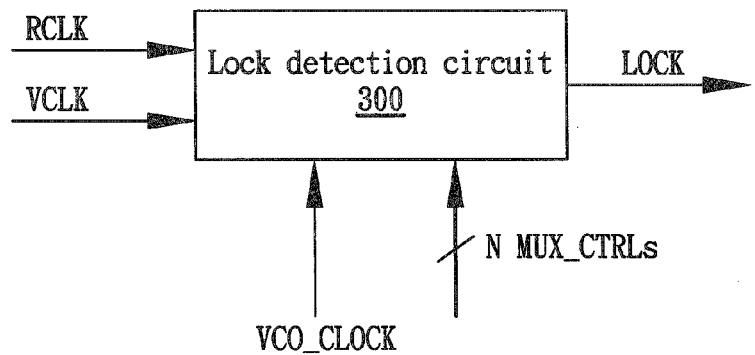
FIG. 3 shows a block diagram of a lock detection circuit in accordance with an embodiment of the present invention.

FIG. 3 shows a block diagram of a lock detection circuit 300 in accordance with an embodiment of the present invention. The lock detection circuit 300 may be connected to the typical phase locked loop system 100 as shown in FIG. 1, so as to determine whether the phase locked loop system 100 is already in locked state. Particularly, the lock detection circuit 300 receives the reference clock signal RCLK, the divided VCO clock signal VCLK, and the voltage controlled oscillator (VCO) clock VCO_CLOCK of the phase locked loop system 100 of FIG. 1. A VCO clock with frequency greater than that of the input clock signal PIN of the phase locked loop system 100 is feasible for embodiments of the present invention. A VCO clock with frequency between 500 MHz and 1 GHz is preferred. The lock detection circuit 300 provides a phase lock indicating signal LOCK to indicate the status of the phase locked loop system 100. When the lock detection circuit 300 determines that the phase locked loop system 100 is locked, the phase lock indicating signal LOCK will be asserted. On the other hand, the lock detection circuit 300 may also receive a plurality of error tolerance control signals MUX_CTRLs to control or adapt the static phase error tolerance. If the lock detection circuit 300 receives N error tolerance control signals MUX_CTRLs, then there are $2^N$ tolerances for static phase error can be selected. Depending on the requirements of the overall system, the extent of the static phase error tolerance can be changed through the selection of the error tolerance control signals MUX_CTRLs. Detail about the error tolerance control signals will be described in subsequent embodiments.

According to another embodiment of the present invention, the lock detection circuit 300 in FIG. 3 may also connect to the UP clock signal and the DOWN clock signal of the typical phase locked loop system 100 shown in FIG. 1, instead of the reference clock signal RCLK and the divided VCO clock signal VCLK.

Figure 4:
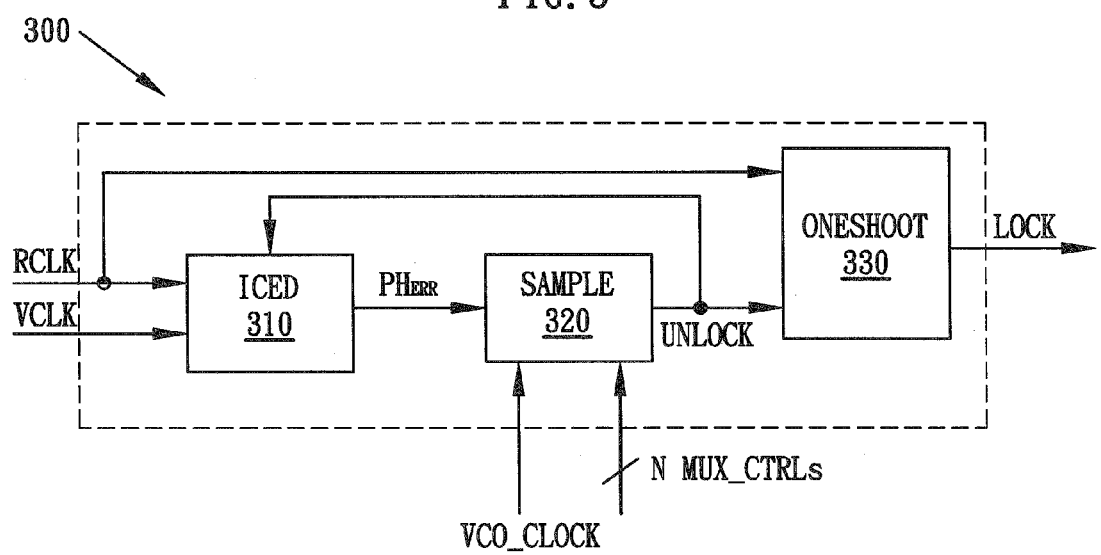
FIG. 4 shows a more detailed block diagram of the lock detection circuit of FIG. 3 in accordance with an embodiment of the present invention.

FIG. 4 shows a more detailed block diagram of the lock detection circuit 300 which includes an input clock error detection logic unit (ICED) 310, a sampling logic unit (SAMPLE) 320, and a one-shoot counting logic unit (ONE-SHOOT) 330. The input clock error detection logic unit 310 receives the reference clock signal RCLK and the divided VCO clock signal VCLK of the phase locked loop system 100, and outputs a phase error signal $PH_{ERR}$ thereof to the sampling logic unit 320. The phase error signal $PH_{ERR}$ represents the static phase error of the phase locked loop system 100. As can be noted in FIG. 4, the input clock error detection logic unit 310 receives an unlock indicating signal UNLOCK from the sampling logic unit 320.

The sampling logic unit 320 receives the phase error signal $PH_{ERR}$ from the input clock error detection logic unit 310 as already described above. In addition, the sampling logic unit 320 also receives the VCO clock VCO_CLOCK which is the output of the voltage controlled oscillator 150 of the phase locked loop system 100; the sampling logic unit 320 provides the aforementioned unlock indicating signal UNLOCK to the input clock error detection logic unit 310 and the one-shoot counting logic unit 330. The sampling logic unit 320 also takes the a plurality of error tolerance control signals MUX_CTRLs as inputs.

The one-shoot counting logic unit 330 receives the reference clock signal RCLK of the phase locked loop system 100 as well as the unlock indicating signal UNLOCK from the sampling logic unit 320. The one-shoot counting logic unit 330 provides a phase lock indicating signal LOCK which is asserted as soon as the phase locked loop system 100 enters a locked state. Particularly, if the unlock indicating signal UNLOCK has not been asserted within a predetermined number of the reference clock signal RCLK pulses, then the phase lock indicating signal LOCK will be asserted to indicate that the phase locked loop system is locked.

Figure 5:
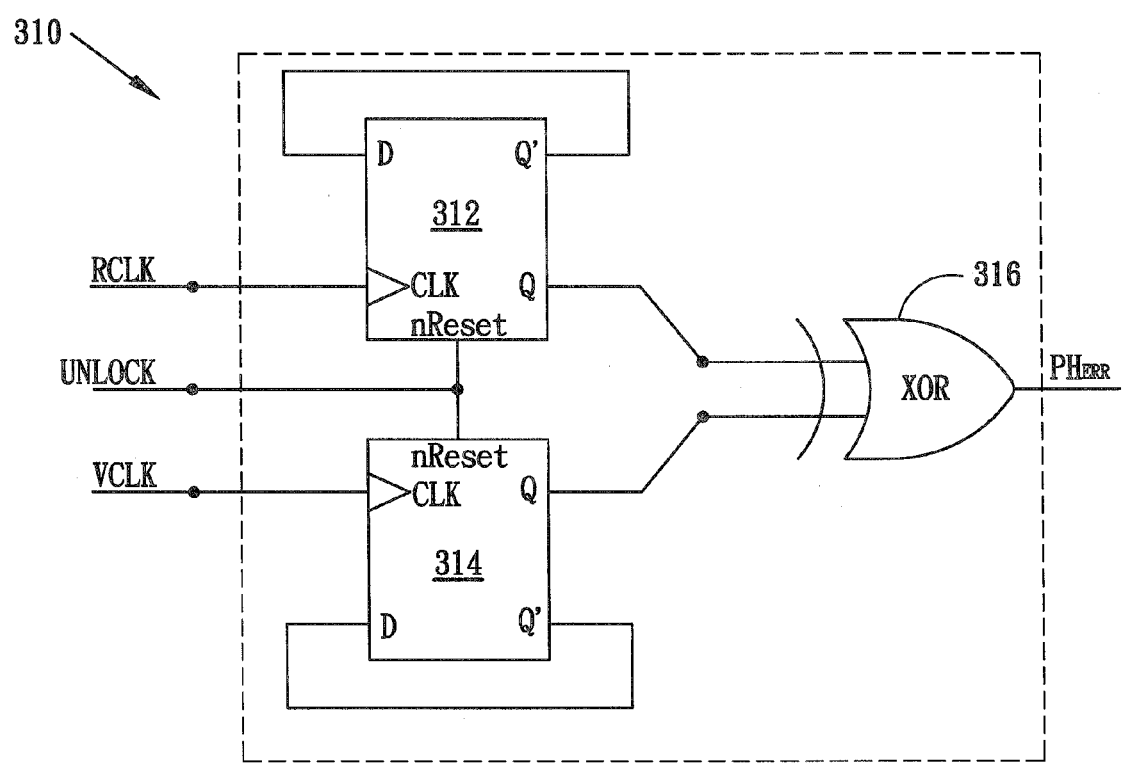
FIG. 5 shows a logic circuit diagram of the input clock error detection logic unit shown in FIG. 4 in accordance with an embodiment of the present invention.

FIG. 5 shows a logic circuit diagram of the input clock error detection logic unit 310 shown in FIG. 4 in accordance with an embodiment of the present invention. The input clock error detection logic unit 310 may include a first flip-flop 312 and a second flip-flop 314 connected in parallel as well as an XOR gate 316. The first flip-flop 312 receives the reference clock signal RCLK of the phase locked loop system 100 at the clock input terminal CLK. The data input terminal D of the first flip-flop 312 is connected to the inverse data output terminal Q' of itself. The data output terminal Q of the first flip-flop 312 is connected to an input of the XOR gate 316. The second flip-flop 314 receives the divided VCO clock signal VCLK of the phase locked loop system 100 at the clock input terminal CLK. The data input terminal D of the second flip-flop 314 is connected to the inverse data output terminal Q' of itself. The data output terminal Q of the second flip-flop 314 is connected to another input of the XOR gate 316. The reset terminals nReset of the first flip-flop 312 and the second flip-flop 314 are connected together and receive the unlock indicating signal UNLOCK from the sampling logic unit 320. The XOR gate 316 outputs the phase error signal $PH_{ERR}$ between the reference clock signal RCLK and the divided VCO clock signal VCLK. The input clock error detection logic unit 310 shown in FIG. 5 is for illustration only. Those skilled in the art should be able to replace it by other input clock error detection circuits.

Figure 6A:
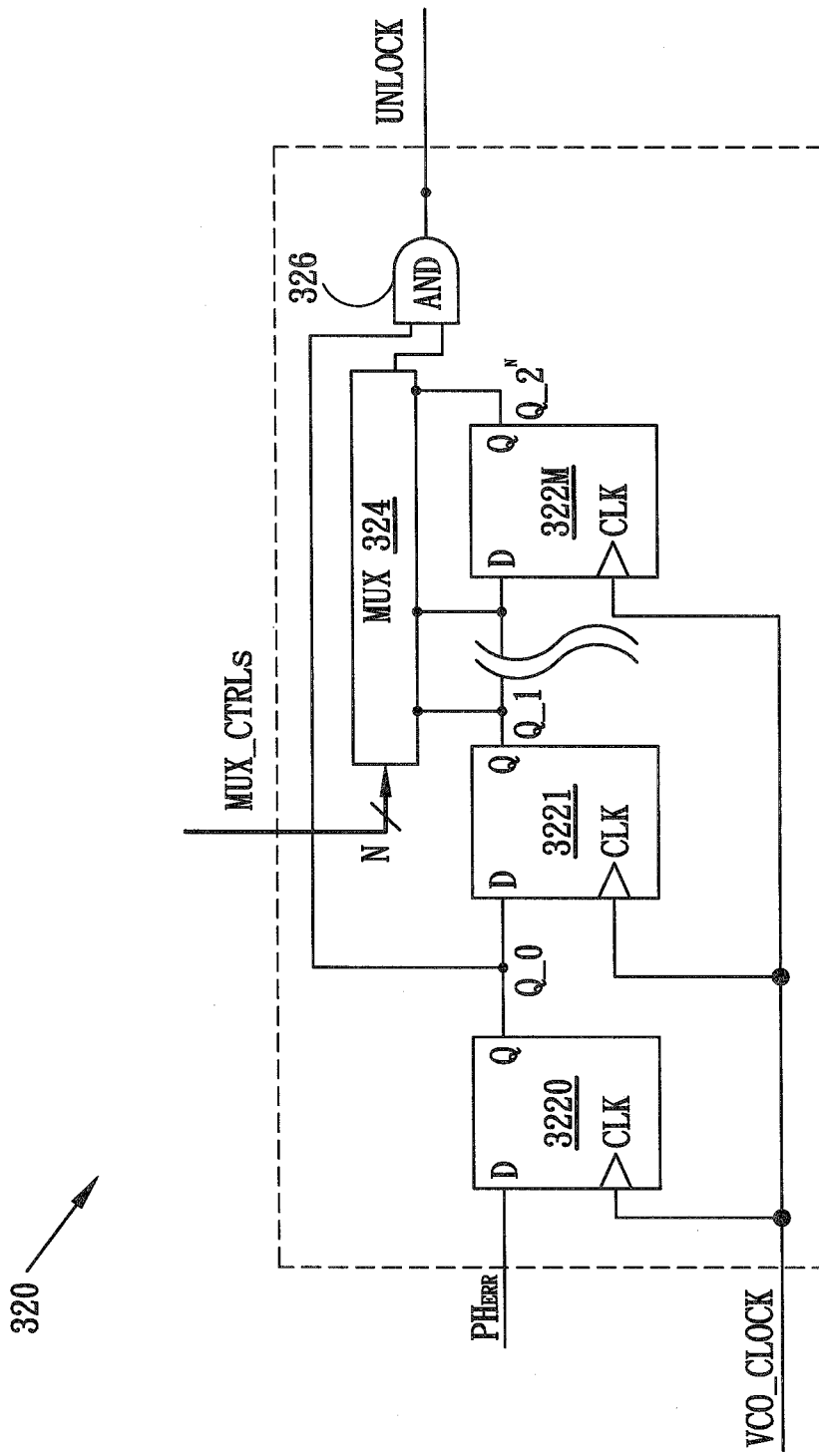
FIG. 6A illustrates a logic circuit diagram of the sampling logic unit shown in FIG. 4 in accordance with an embodiment of the present invention.

FIG. 6A illustrates an example logic circuit diagram of the sampling logic unit 320 which includes a plurality of flip-flops (3220-322M), a multiplexer (MUX) 324, and a logic AND gate 326. The aforementioned plurality of error tolerance control signals MUX_CTRLs connect to the selection lines of the multiplexer 324. If the number of the plurality of error tolerance control signals MUX_CTRLs is N, the multiplexer 324 may choose one as the output from 2N inputs through the N selection lines. The output of the multiplexer 324 is connected to an input terminal of the logic AND gate 326. The logic AND gate 326 provides the unlock indicating signal UNLOCK at the output terminal thereof. The flip-flop 3220 receives the phase error signal $PH_{ERR}$ at the data input terminal D. Regarding to the plurality of flip-flops (3220-322M), the Q output terminal of a prior stage flip-flop is connected to the data input terminal D of the subsequent stage flip-flop. Those skilled in the art should appreciate that a shift register is formed through such serial connection architecture. The output terminal Q of the flip-flop 3220 is the first stage output of the shift register. As deduced by analogy, the output terminal Q of the flip-flop 322M will be the last stage output of the shift register. Besides connecting to the data input terminal D of the flip-flop 3221, the data output terminal Q of the flip-flop 3220 is also connected to another input of the logic AND gate 326. Among the plurality of flip-flops (3220-322M), except the first stage flip-flop 3220, the data output terminals Q's of other flip-flops (3221-322M) are all connected the input terminals of the multiplexer 324. Accordingly and as implied by FIG. 6A, M is equal to $2^N a$, in which N represents the number of the selection lines of the multiplexer 324. The clock input terminals CLKs of the plurality of flip-flops (3220-322M) are signal connected together and receive the voltage controlled oscillator clock signal VCO_CLOCK from the phase locked loop system 100. The logic AND gate 326 outputs the unlock indicating signal UNLOCK. When both the data output terminal Q of the first stage flip-flop 3220 (providing a present phase error) and the output terminal of the multiplexer 324 (providing a selected delayed phase error) have a high level output, the logic AND gate 326 will assert the unlock indicating signal UNLOCK.

In this embodiment, the flip-flops (3220-322M) are used to provide a plurality of delayed or shifted phase error signal $PH_{ERR}$. Other delay circuits may apply to the present invention as appreciated by those skilled in the art. In addition, although the multiplexer 324 is illustrated in this embodiment to select one phase error signal from a plurality of delayed versions thereof, other type of selecting devices may be applicable to the present invention. Particularly, the multiplexer 324 may be removed if the adaptability about the phase error tolerance is a minor factor. In another embodiment according to the present invention, the logic AND gate 326 of the sampling logic unit 320 may be replaced by a logic NAND gate, a logic OR gate, or a logic NOR gate, depending upon a positive logic system, a negative logic system, or a combination thereof being adopted for the entire circuit design methodology.

Figure 6B:
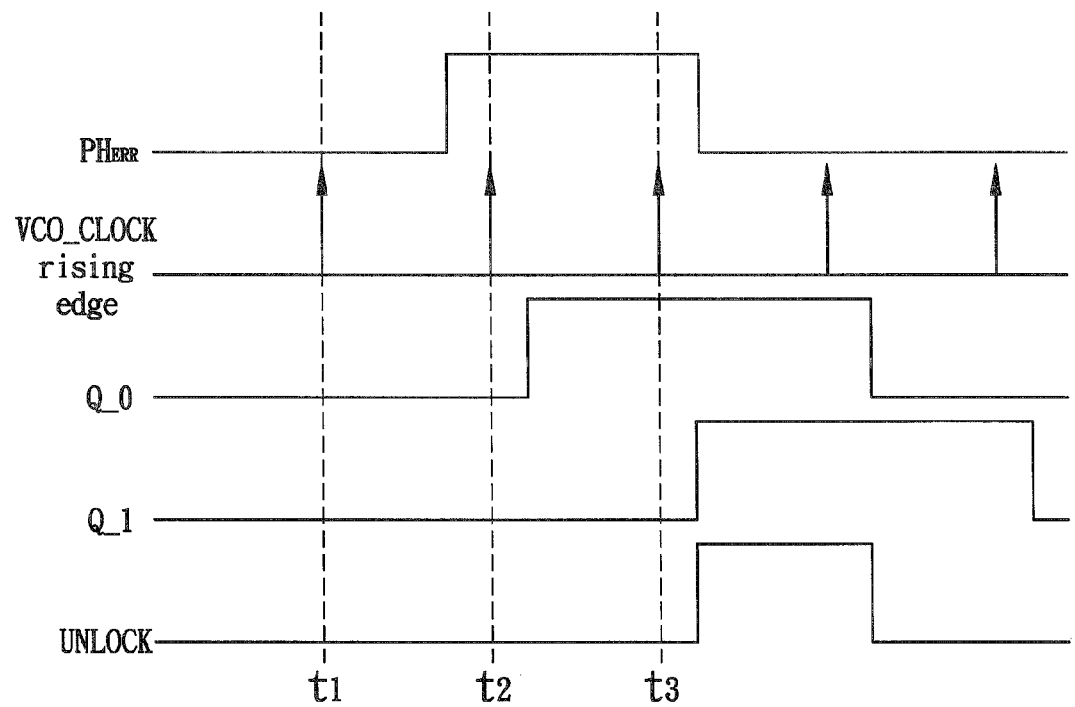
FIG. 6B shows a timing diagram of signals in the sampling logic unit shown in FIG. 6A.

FIG. 6B shows a timing diagram of signals in the sampling logic unit 320 shown in FIG. 6A. FIG. 6B illustrates the timing diagram for the case when the multiplexer 324 selects the data output Q_1 of the second stage flip-flop 3221 as the output. The timing diagram shows the timing relationship regarding the phase error signal $PH_{ERR}$, the voltage controlled oscillator clock signal VCO_CLOCK, the data output Q_0 of the first stage flip-flop 3220, the data output Q_1 of the second stage flip-flop 3221, as well as the output signal UNLOCK of the logic AND gate 326. Assume that all flip-flops (3220-322M) are reset at an initial time t0 (not shown in the figure), in other words, all flip-flop Q outputs are cleared to low levels at very beginning. In the rising edge of VCO_CLOCK at time t1, the phase error signal $PH_{ERR}$ is low which means the reference clock signal RCLK is in phase with the divided VCO clock signal VCLK. The low levels of $PH_{ERR}$ and Q_0 are respectively loaded into the flip-flop 3220 and the flip-flop 3221 at the VCO_CLOCK rising edge of t1. Q_0 and Q_1 remain at low level after t1 such that the output signal UNLOCK of the logic AND gate 326 also remains at low level. In the rising edge of VCO_CLOCK at time t2, the phase error signal $PH_{ERR}$ goes high which means the reference clock signal RCLK is out of phase with the divided VCO clock signal VCLK. The high level of $PH_{ERR}$ and the low level of Q_0 are respectively loaded into the flip-flop 3220 and the flip-flop 3221 at the VCO_CLOCK rising edge of t2. Q_0 becomes high level while Q_1 remain at low level after t2 such that the output signal UNLOCK of the logic AND gate 326 still remains at low level. In the rising edge of VCO_CLOCK at time t3, the phase error signal $PH_{ERR}$ remains at high, which means the reference clock signal RCLK is still out of phase with the divided VCO clock signal VCLK. The high levels of $PH_{ERR}$ and Q_0 are respectively loaded into the flip-flop 3220 and the flip-flop 3221 at the VCO_CLOCK rising edge of t3. Q_0 and Q_1 both go high level after t3 such that the output signal UNLOCK of the logic AND gate 326 also goes to high level, which means the phase difference between the reference clock signal RCLK and the divided VCO clock signal VCLK has exceeded the selected phase error tolerance.

Figure 6C:
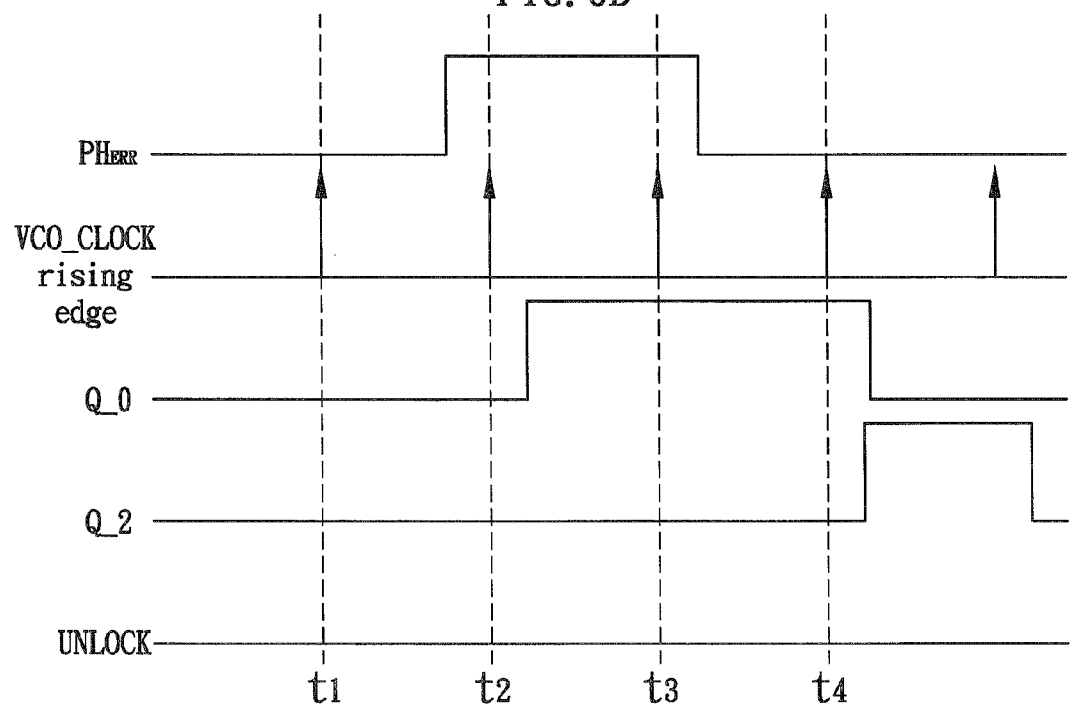
FIG. 6C shows another timing diagram of signals in the sampling logic unit shown in FIG. 6A.

FIG. 6C shows another timing diagram of signals in the sampling logic unit 320 shown in FIG. 6A. Different with FIG. 6B, FIG. 6C shows the case when the multiplexer 324 chooses the data output Q_2 of a third stage flip-flop 3222 (not shown in the figure) as the output. Accordingly, FIG. 6C illustrates the timing relationship regarding the phase error signal $PH_{ERR}$, the voltage controlled oscillator clock signal VCO_CLOCK, the data output Q_0 of the first stage flip-flop 3220, the data output Q_2 of the third stage flip-flop 3222, as well as the output signal UNLOCK of the logic AND gate 326. FIG. 6C is identical with FIG. 6B during the time period from t0 to t2. In the rising edge of VCO_CLOCK at time t3, the phase error signal $PH_{ERR}$ remains at high, which means the reference clock signal RCLK is still out of phase with the divided VCO clock signal VCLK. The high levels of $PH_{ERR}$ and Q_0 are respectively loaded into the flip-flop 3220 and the flip-flop 3221 at the VCO_CLOCK rising edge of t3. Q_0 and Q_1 both go high level after t3. However, the flip-flop's data output Q_2 remains at low in this case. Since Q_2 is selected as the output of the multiplexer 324, the output UNLOCK of logic AND gate 326 still remains at low level which is the logic AND result of Q_0 and Q_2. In this case, the phase difference between the reference clock signal RCLK and the divided VCO clock signal VCLK is under the selected phase error tolerance. In other words, such kind of phase error does not prevent the phase locked loop from being determined to be locked. FIG. 6C and FIG. 6B on purpose illustrate different results on locked state determination with respect to an identical phase error signal $PH_{ERR}$. It is clear that different setting of selection lines of the multiplexer 324 selects different phase error tolerances.

Figure 7:
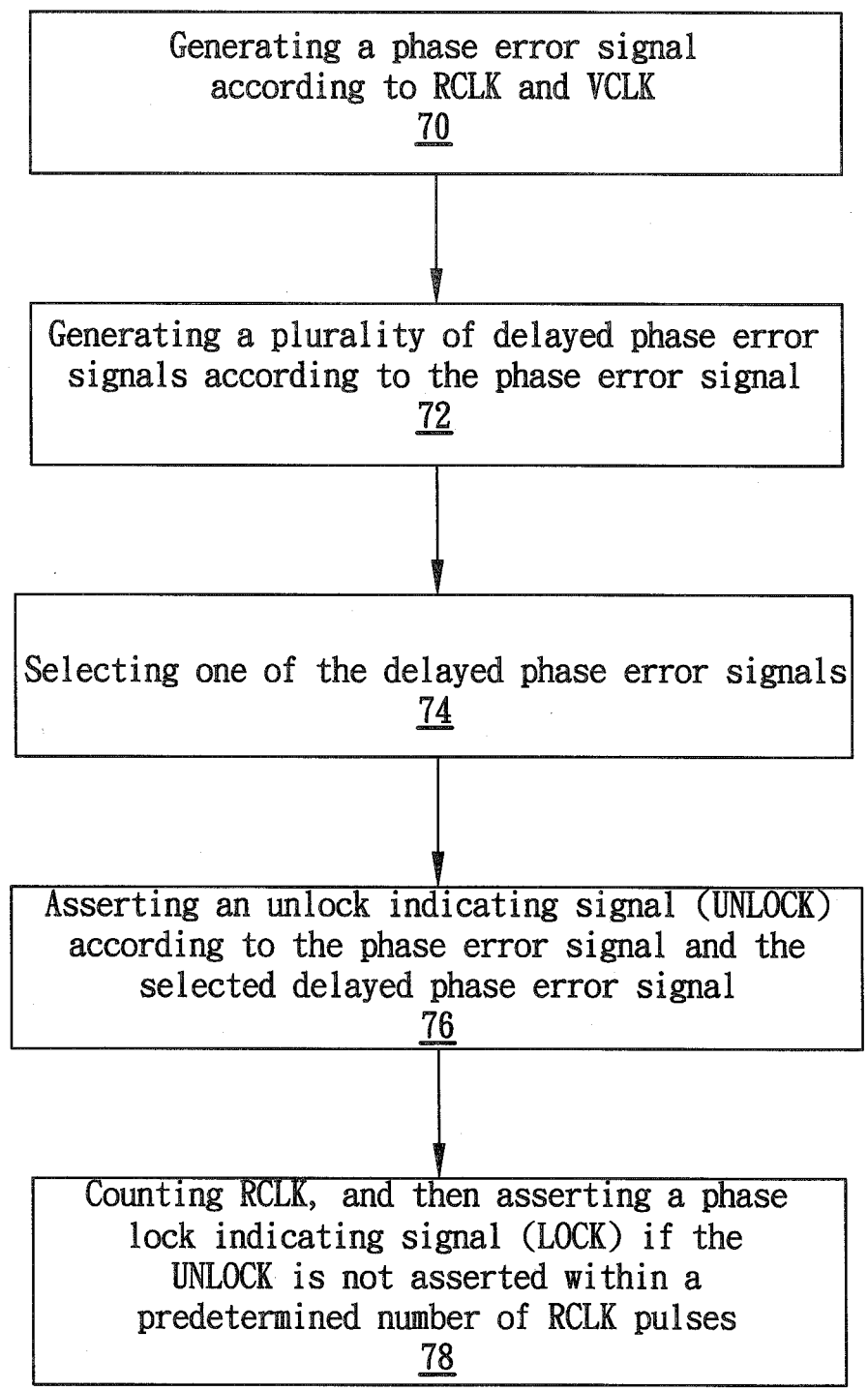
FIG. 7 shows a lock detection method in accordance with an embodiment of the present invention.

As mentioned above, due to element mismatching, process variation, or a temperature factor, a lock detection circuit may fail to neglect a static phase error while a phase locked loop system is in fact locked. To resolve such a problem, the sampling logic unit 320 in accordance with the present invention may use a larger phase error tolerance, in other words, the multiplexer 324 may select a rear stage flip-flop as the output thereof. According to the lock detection circuit 300 disclosed above, the present invention also provides a lock detection method as illustrated by the embodiment shown in FIG. 7. At first, generating a phase error signal $PH_{ERR}$ according to the reference clock signal RCLK and the divided VCO clock signal VCLK of a phase locked loop system (step 70). Then, generating a plurality of delayed phase error signals according to the phase error signal $PH_{ERR}$ (step 72). After selecting one of the delayed phase error signals (step 74), asserting an unlock indicating signal (UNLOCK) according to the phase error signal and the selected delayed phase error signal (step 76). Finally, counting pulses of the reference clock signal RCLK, and then asserting a phase lock indicating signal (LOCK) if the unlock indicating signal UNLOCK is not asserted within a predetermined number of RCLK pulses (step 78).

The above examples and description have been provided only for the purpose of illustration, and are not intended to limit the invention in any way. Many modifications and variations are possible in light of the above teaching. It is intended that the scope of the invention be limited not with this detailed description, but rather by the claims appended hereto.

What is claimed is:

1. A lock detection circuit for a phase locked loop system (PLL), comprising:
    a delayed unit receiving a phase error signal from the phase locked loop system to generate a present phase error signal, and then generating a plurality of delayed phase error signals according to the present phase error signal;
    a selecting unit that according to a designated phase error tolerance selecting one of the plurality of delayed phase error signals from the plurality of delayed phase error signals ; and
    a logic asserting unit providing an unlock indicating signal according to the present phase error signal and the selected one of the plurality of delayed phase error signals, wherein the phase error signal is generated according to the unlock indicating signal.

2. The lock detection circuit of claim 1, further comprising a selection device receiving the plurality of delayed phase error signals and selecting one of the plurality of delayed phase error signals as output.

3. The lock detection circuit of claim 2, wherein the selection device is a multiplexer selecting one of the plurality of delayed phase error signals according to at least one error tolerance control signal.

4. The lock detection circuit of claim 1, wherein the delayed unit is a shift register receiving the phase error signal to generate the plurality of delayed phase error signals.

5. The lock detection circuit of claim 4, wherein the shift register comprises a plurality of flip-flops connected in serial, the plurality of flip-flops providing the plurality of delayed phase error signals.

6. The lock detection circuit of claim 5, wherein the plurality of flip-flops receive a voltage controlled oscillator (VCO) clock signal of the phase locked loop system at clock input terminals.

7. The lock detection circuit of claim 1, wherein the phase error signal is adjusted according to a plurality of error tolerance control signals.

8. A lock detection circuit for a phase locked loop system, comprising:
    an input clock error detection logic unit, generating a phase error signal according to a reference clock signal, an unlock indicating signal, and a divided voltage controlled oscillator (VCO) clock signal of the phase locked loop system;
    a sampling logic unit, generating a present phase error signal according to the phase error signal, and then generating a plurality of delayed phase error signals according to the present phase error signal, and then providing the unlock indicating signal according to the present phase error signal and the selected one of the plurality of delayed phase error signals, wherein the one of the plurality of delayed phase error signals is selected according to a designated phase error tolerance from the plurality of delayed phase error signals; and
    a counting logic unit, configured to count pulses of the reference clock signal and assert a phase lock indicating signal if the unlock indicating signal is not asserted within a predetermined number of the pulses of the reference clock signal.

9. The lock detection circuit of claim 8, wherein the sampling logic unit comprises:
    a delayed unit receiving the phase error signal to generate the plurality of delayed phase error signals; and
    a logic asserting unit providing the unlock indicating signal according to the present phase error signal and the plurality of delayed phase error signals.

10. The lock detection circuit of claim 9, further comprising a selection device receiving the plurality of delayed phase error signals and selecting one of the plurality of delayed phase error signals as output.

11. The lock detection circuit of claim 10, wherein the selection device is a multiplexer selecting one of the plurality of delayed phase error signals according to at least one error tolerance control signal.

12. The lock detection circuit of claim 9, wherein the delayed unit is a shift register receiving the phase error signal to generate the plurality of delayed phase error signals.

13. The lock detection circuit of claim 12, wherein the shift register comprises a plurality of flip-flops connected in serial, the plurality of flip-flops providing the plurality of delayed phase error signals.

14. The lock detection circuit of claim 13, wherein the plurality of flip-flops receive a voltage controlled oscillator (VCO) clock signal of the phase locked loop system at clock input terminals.

15. The lock detection circuit of claim 8, wherein the counting logic unit is a one-shoot counter which counts pulses of the reference clock signal and is reset when the unlock indicating signal is asserted.

16. The lock detection circuit of claim 8, wherein the input clock error detection logic unit comprises:
- an UP/DOWN clock signal generating circuit, providing an UP clock signal and a DOWN clock signal according to the reference clock signal and the divided VCO clock signal of the phase locked loop system; and
- an exclusive OR logic gate, receiving the UP clock signal and the DOWN clock signal to generate the phase error signal.

17. The lock detection circuit of claim 16, wherein the UP/DOWN clock signal generating circuit comprises two flip-flops connected in parallel, clock input terminals of the two flip-flops respectively receiving the reference clock signal and the divided VCO clock signal, reset terminals of the two flip-flops being controlled by the unlock indicating signal, data input terminals of the two flip-flops being respectively connected to inverse data output terminals, data output terminals of the two flip-flops being connected to input terminals of the exclusive OR logic gate.

18. The lock detection circuit of claim 8, wherein the phase error signal is adjusted according to a plurality of error tolerance control signals.

19. A lock detection method for a phase locked loop system, comprising:
- generating a phase error signal according to a reference clock signal, an unlock indicating signal, and a divided voltage controlled oscillator (VCO) clock signal of the phase locked loop system;
- generating a present phase error signal according to the phase error signal, and generating a plurality of delayed phase error signals according to the present phase error signal;
- providing the unlock indicating signal according to the present phase error signal and one of the plurality of delayed phase error signals,
- selecting the one of the plurality of delayed phase error signals according to a designated phase error tolerance from the plurality of delayed phase error signals ; and
- counting pulses of the reference clock signal and asserting a phase lock indicating signal if the unlock indicating signal is not asserted within a predetermined number of the pulses of the reference clock signal.

20. The lock detection method of claim 19, wherein the plurality of delayed phase error signals is generated by providing the phase error signal to a shift register which in turn generates the plurality of delayed phase error signals.

21. The lock detection method of claim 19, wherein the unlock indicating signal is asserted when the present phase error signal and one of the plurality of delayed phase error signals are both asserted.

22. The lock detection circuit of claim 1, wherein the phase error signal indicates a phase difference between a reference clock signal and a divided voltage controlled oscillator (VCO) clock signal of the phase locked loop system.

23. The lock detection method of claim 19, wherein the phase error signal is adjusted according to a plurality of error tolerance control signals.

\* \* \* \* \*